(12) United States Patent
Yu et al.

(10) Patent No.: US 11,189,559 B2
(45) Date of Patent: Nov. 30, 2021

(54) SEMICONDUCTOR DEVICE AND FABRICATION METHOD THEREOF

(71) Applicant: Vanguard International Semiconductor Corporation, Hsinchu (TW)

(72) Inventors: Chi-Hua Yu, Kaohsiung (TW); Shih-Tsung Kung, Hsinchu County (TW); Wen-Chun Chung, Hsinchu (TW); Yi-Hong Hong, New Taipei (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 16/861,176

(22) Filed: Apr. 28, 2020

(65) Prior Publication Data

US 2021/0225756 A1 Jul. 22, 2021

(30) Foreign Application Priority Data

Jan. 22, 2020 (TW) .................................. 109102345

(51) Int. Cl.
*H01L 29/00* (2006.01)
*H01L 23/522* (2006.01)
*H01L 49/02* (2006.01)

(52) U.S. Cl.
CPC .......... *H01L 23/5223* (2013.01); *H01L 28/60* (2013.01)

(58) Field of Classification Search
CPC .......................... H01L 23/5223; H01L 28/60
USPC .......................................................... 257/532
See application file for complete search history.

(56) References Cited

U.S. PATENT DOCUMENTS

| | | | |
|---|---|---|---|
| 6,459,562 B1 | 10/2002 | KarRoy | |
| 6,995,092 B2 * | 2/2006 | Umeda | H01L 21/31691 438/706 |
| 7,820,506 B2 * | 10/2010 | Rocklein | H01L 29/51 438/240 |
| 2002/0192919 A1 | 12/2002 | Bothra | |

* cited by examiner

*Primary Examiner* — Theresa T Doan
(74) *Attorney, Agent, or Firm* — Winston Hsu (57) ABSTRACT

A semiconductor device includes a substrate, a capacitor disposed on the substrate, and an interconnection structure. The capacitor is disposed on the substrate within a capacitor region and includes a lower electrode, an upper electrode, a stacked dielectric layer, and an intermediate dielectric layer. The upper electrode is disposed over the lower electrode, and the stacked dielectric layer is disposed between the lower electrode and the upper electrode. The intermediate dielectric layer is disposed between the lower electrode and the upper electrode and disposed only within the capacitor region. The relative permittivity of the intermediate dielectric layer is greater than the relative permittivity of the stacked dielectric layer. The interconnection structure including a plug and a stack of metal layers is disposed within an interconnection region abutting the capacitor region and is disposed at at least one side of the intermediate dielectric layer.

13 Claims, 7 Drawing Sheets

SEMICONDUCTOR DEVICE AND FABRICATION METHOD THEREOF

CROSS REFERENCE TO RELATED APPLICATION

This application claims the priority benefit of Taiwan patent application Ser. No. 109102345, filed Jan. 22, 2020, the disclosure of which is incorporated by reference herein in its entirety.

BACKGROUND OF THE INVENTION

1. Field of the Invention

The present disclosure relates generally to a semiconductor device, and more particularly, to a semiconductor device having a high-voltage capacitor.

2. Description of the Prior Art

For a semiconductor device with a high-voltage component, the high-voltage component is generally electrically connected to a high-voltage source, such as a voltage source of 1 kV to 15 kV (DC or AC). For the case where a high-voltage component is a capacitor which is fabricated together with an interconnection structure, the dielectric layer of the capacitor is usually constituted by an inter-metal dielectric (IMD) of a semiconductor device. Since the voltage-sustaining capability of the capacitor or the semiconductor device is correlated to the thickness of the dielectric layer of the capacitor, in order to increase the voltage-sustaining capability (or breakdown voltage) of the capacitor or the semiconductor device, a common solution is to increase the thickness of the dielectric layer of the capacitor.

However, even if the voltage-sustaining capacity of the capacitor or the semiconductor device may be increased by using the above-mentioned method, the method could result in other technical drawbacks. For example, since the dielectric layer of the capacitor is composed of the inter-metal dielectric of the semiconductor device, the increase in the thickness of the dielectric layer of the capacitor may cause the increase in the inter-metal dielectric. As a result, the substrate used to support the semiconductor device may be warped when the thicker dielectric layer of the capacitor and the thicker inter-metal dielectric are disposed on the substrate. Besides, the change in the thickness of the inter-metal dielectric also affects the original process of fabricating the inter-metal dielectric layer, and this change could negatively affect and complicate the original process of fabricating the semiconductor device.

Therefore, there is a need to provide an improved semiconductor device and a method for fabricating the same to solve the drawbacks in the prior art.

SUMMARY OF THE INVENTION

In view of the above, it is necessary to provide an improved semiconductor device and a fabrication method thereof in order to solve the technical problems in the prior art.

According to one embodiment of the present disclosure, a semiconductor device is provided and includes a substrate, a capacitor disposed on the substrate, and an interconnection structure. The capacitor is disposed on the substrate within a capacitor region and includes a lower electrode, an upper electrode, a stacked dielectric layer, and an intermediate dielectric layer. The upper electrode is disposed over the lower electrode, and the stacked dielectric layer is disposed between the lower electrode and the upper electrode. The intermediate dielectric layer is disposed between the lower electrode and the upper electrode and disposed only within the capacitor region. The relative permittivity of the intermediate dielectric layer is greater than the relative permittivity of the stacked dielectric layer. The interconnection structure including a plug and a stack of metal layers is disposed within an interconnection region abutting the capacitor region and is disposed at at least one side of the intermediate dielectric layer.

According to another embodiment of the present disclosure, a method for fabricating a semiconductor device is provided and includes the following steps: providing a substrate; forming a lower electrode on the substrate; forming at least one sub-dielectric layer on the lower electrode; patterning the dielectric layer to form an intermediate dielectric layer, where the intermediate dielectric layer exposes a part of the at least one sub-dielectric layer; etching portions of the at least one sub-dielectric layer not covered by the intermediate dielectric layer to thereby form a hole; filling at least one plug into the hole; and forming an upper electrode on the intermediate dielectric layer.

According to the embodiments of the present disclosure, by providing the intermediate dielectric layer with relatively high relative permittivity between the lower electrode and the upper electrode, the breakdown voltage of the capacitor and the semiconductor devices as well as the voltage sustaining capability of the corresponding semiconductor devices may be increased even though the distance between the upper electrode and the lower electrode in the capacitor is not increased.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

For more complete understanding of the present invention and its advantage, reference is now made to the following description, taken in conjunction with accompanying drawings, in which.

DETAILED DESCRIPTION

The following disclosure provides many different embodiments, or examples, for implementing different features of the disclosure. Specific examples of components and arrangements are described below to simplify the present disclosure. These are, of course, merely examples and are not intended to be limiting.

For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "over," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as "below" and/or "beneath" other elements or features would then be oriented "above" and/or "over" the other elements or features. The apparatus may be otherwise oriented (rotated 90 degrees or at other orientations) and the spatially relative descriptors used herein may likewise be interpreted accordingly.

It is understood that, although the terms first, second, third, etc. may be used herein to describe various elements, components, regions, layers and/or sections, these elements, components, regions, layers and/or sections should not be limited by these terms. These terms may be only used to distinguish one element, component, region, layer and/or section from another region, layer and/or section. Terms such as "first," "second," and other numerical terms when used herein do not imply a sequence or order unless clearly indicated by the context. Thus, a first element, component, region, layer and/or section discussed below could be termed a second element, component, region, layer and/or section without departing from the teachings of the embodiments.

As disclosed herein, the term "about" or "substantial" generally means within 20%, 10%, 5%, 3%, 2%, 1%, or 0.5% of a given value or range. Unless otherwise expressly specified, all of the numerical ranges, amounts, values and percentages disclosed herein should be understood as modified in all instances by the term "about" or "substantial". Accordingly, unless indicated to the contrary, the numerical parameters set forth in the present disclosure and attached claims are approximations that can vary as desired.

The terms, such as "coupled to" and "electrically connected to", disclosed herein encompass all means of directly and indirectly electrical connection. For example, when an element or layer is referred to as being "coupled to" or "electrically connected to" another element or layer, it may be directly coupled or electrically connected to the other element or layer, or intervening elements or layers may be presented.

It should be noted that the term "dielectric constant ($\varepsilon_r$)" disclosed herein means "relative permittivity", which is measured at room temperature (20° C.) and under electric field at a frequency of 1 kHz.

Although the disclosure is described with respect to specific embodiments, the principles of the invention, as defined by the claims appended herein, can obviously be applied beyond the specifically described embodiments of the invention described herein. Moreover, in the description of the present disclosure, certain details have been left out in order to not obscure the inventive aspects of the disclosure. The details left out are within the knowledge of a person of ordinary skill in the art.

Figure 1:
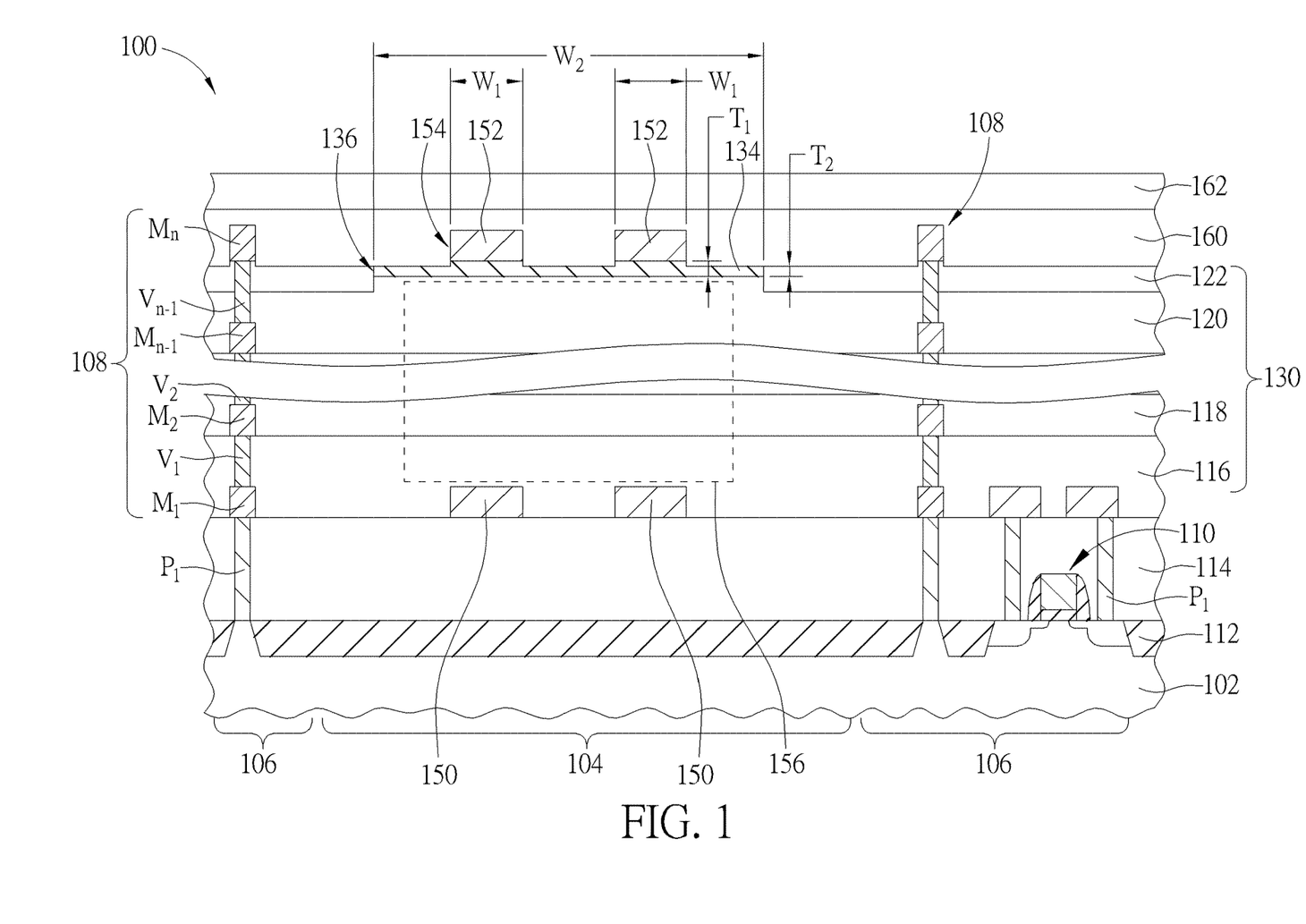
FIG. 1 is a schematic cross-sectional diagram of a semiconductor device according to one embodiment of the disclosure.

FIG. 1 is a schematic cross-sectional diagram of a semiconductor device according to one embodiment of the disclosure. As shown in FIG. 1, the semiconductor device 100 includes a substrate 102, and includes a high-voltage component region, such as a capacitor region 104, and an interconnection region 106, such as an interconnection structure 108. The interconnection region 106 may further include a transistor 110. In the case where the high-voltage component is a capacitor, the capacitor 104 may include a lower electrode 150, an upper electrode 152, and a capacitor dielectric layer 156 (constituted by a portion of the stacked dielectric layer 130) disposed between the lower electrode 150 and the upper electrode 152, and an intermediate dielectric layer 134 disposed between the upper electrode 152 and the lower electrode 150. According to one embodiment of the present disclosure, the intermediate dielectric layer 134 is preferably a single-layered structure that directly contacts the upper electrode 152 and the stacked dielectric layer 130, and the relative permittivity of the intermediate dielectric layer 134 is greater than the relative permittivity of the stacked dielectric layer 130. By providing the intermediate dielectric layer 134 between the upper electrode 152 and the capacitor dielectric layer 156, the breakdown voltage of the capacitor in the capacitor region 104 and the semiconductor device 100 may be increased. For example, when a high-voltage (DC or AC) is applied to the electrode 152, a breakdown voltage of the capacitor in the capacitor region 104 and the semiconductor device 100 may be kept at a high level. According to another embodiment of the present application, the intermediate dielectric layer 134 may be disposed between adjacent two of the sub-dielectric layers 116, 118, and 120, and the intermediate dielectric layer 134 is disposed only in the capacitor region 104. Referring to FIG. 1, the semiconductor device 100 is disposed on a substrate 102, such as a silicon substrate, a ceramic substrate, or a silicon-on-insulator (SOI) substrate. The substrate 102 may include an insulation structure 112, such as shallow trench isolation (STI), so that the substrate 102 may be divided by the insulation structure 112 into different regions. Various semiconductor components, such as at least one transistor 110, but not limited thereto, may be disposed at the surface of the substrate 102. A pre-metal dielectric (PMD) 114 may be disposed on the surface of the substrate 102. The pre-metal dielectric 114 may cover the transistor 110, and a conductive contact structure $P_1$ disposed in the pre-metal dielectric 114 may be electrically connected to the substrate 102 or the transistor 110. A stacked dielectric layer 130 including a plurality of sub-dielectric layers, such as the sub-dielectric layers 116, 118, 120, and 122 may be disposed on the pre-metal dielectric 114, and the sub-dielectric layers 116, 118, 120, and 122 may be used to accommodate an interconnect structure 108. The interconnect structure 108 may include at least a stack of metal layers and at least one plug. For example, the a stack of metal layers may be a wire stack including intermediate metal layers $M_1$, $M_2$ to $M_{n-1}$ and a top metal layer $M_n$, and the at least one plug may include a plurality of plugs $V_1$, $V_2$ to $V_{n-1}$, where n may be any positive integer greater than or equal to 7, such as n is equal to 7. The intermediate metal layers $M_1$, $M_2$ to $M_{n-1}$ and the top metal layer $M_n$ in the interconnect structure 108 may be electrically connected to the corresponding plugs $V_1$, $V_2$ to $V_{n-1}$, and the interconnect structure 108 may be used as a path for transmitting electrical signal in the semiconductor device 100. For the semiconductor device 100 including a high-voltage component, such as a high-voltage capacitor, the interconnection structure 108 may be arranged to constitute a Faraday cage to thereby shield the electric field from the high-voltage component.

According to one embodiment of the present disclosure, for the capacitor in the capacitor region 104, the lower electrode 150 and the upper electrode 152 of the capacitor may each include a pair of sub-electrodes. While according to another embodiment of the present disclosure, the lower electrode 150 and the upper electrode 152 may each be a single electrode without any sub-electrodes. The capacitor dielectric layer 156 and the intermediate dielectric layer 134 disposed between the lower electrode 150 and the upper electrode 152 may affect the breakdown voltage of the capacitor in the capacitor region 104. The capacitor dielectric layer 156 may be constituted by a portion of the stacked dielectric layer 130, and a thickness ratio of the stacked dielectric layer 130 and the intermediate dielectric layer 134 may be about 10:1 to 30:1, but not limited thereto. According to one embodiment of the present disclosure, at least one outer edge 136 of the intermediate dielectric layer 134 may extend beyond at least one outer edge 154 of the upper electrode 152, which causes the overall width $W_2$ of the intermediate dielectric layer 134 is wider than the overall widths $W_1$ of the upper electrodes 152. In addition, the thickness $T_1$ of the intermediate dielectric layer 134 which is covered by the upper electrode 152 may be greater than the thickness $T_2$ of the intermediate dielectric layer 134 which is not covered by the upper electrode 152. By providing the laterally-extending intermediate dielectric layer 134 having different thickness in different regions, the breakdown voltage of the semiconductor device 100 and the capacitor in the capacitor region 104 may be further increased.

In addition, according to one embodiment of the present disclosure, the intermediate dielectric layer 134 may be disposed only in the capacitor region 104 and not extend outward to the interconnect structure 108. According to one embodiment, the top metal layer $M_n$ may not directly contact the intermediate dielectric layer 134 but directly contact the stacked dielectric layer 130. Therefore, the high-voltage from the upper electrode 152 may not be transmitted to the top metal layer $M_n$ through the stacked dielectric layer 130, which also increases the breakdown voltage of the semiconductor device 100 and reduces the resistive-capacitive delay (RC-delay) occurring in the interconnection region 106, and simplifies the fabrication process.

A top dielectric layer 160 may be disposed on the stacked dielectric layer 130. The top dielectric layer 160 may surround the upper electrode 152 and the top metal layer $M_n$, and the top dielectric layer 160 may directly contact the upper electrode 152 and the stacked dielectric layer 130. This allows the upper electrode 152 and the top metal layer $M_n$ to be buried in the top dielectric layer 160. A protection mask 162 may be disposed above the top dielectric layer 160. The protection mask 162 and the top dielectric layer 160 may include openings therein to receive solder pads (not shown) which are configured to be electrically connected to the upper electrode 152.

Figure 2:
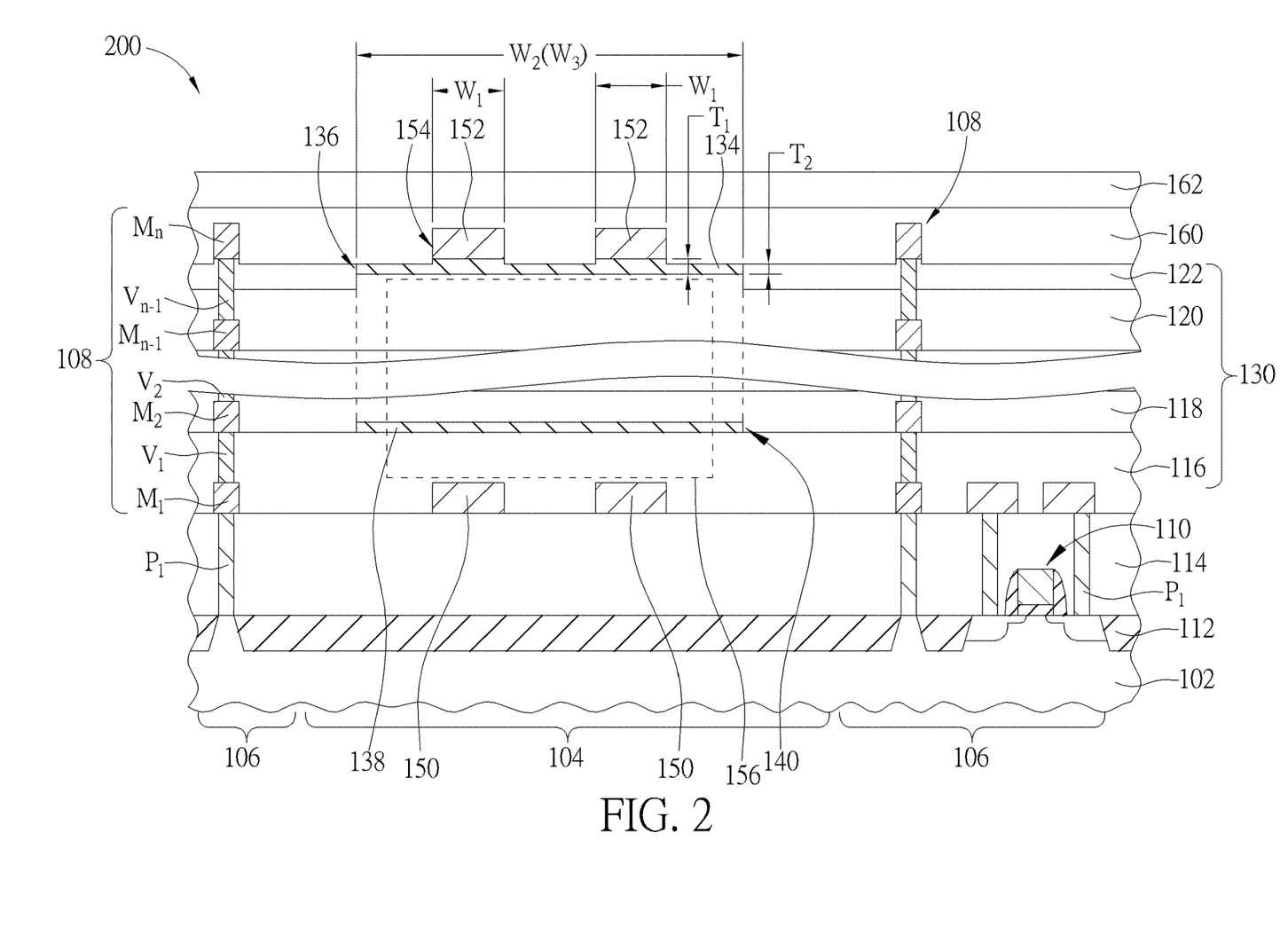
FIG. 2 is a schematic cross-sectional diagram of a semiconductor device according to one embodiment of the disclosure.

FIG. 2 is a schematic cross-sectional diagram of a semiconductor device according to one embodiment of the disclosure. The semiconductor device 200 shown in FIG. 2 is similar to the semiconductor device 100 shown in FIG. 1. The semiconductor device 200 also includes a high-voltage component, such as a capacitor region 104. However, in addition to the intermediate dielectric layer 134, the semiconductor device 200 further includes another intermediate dielectric layer 138. The intermediate dielectric layer 138 is buried in the stacked dielectric layer 130, such as being buried in the sub-dielectric layer 118. The relative permittivity of the intermediate dielectric layer 138 may be greater than the average relative permittivity of the entire stacked dielectric layer 130 or greater than the relative permittivity of any one of the sub-dielectric layers 116, 118, and 120 of the stacked dielectric layer 130. The thickness ratio of the stacked dielectric layer 130 and the intermediate dielectric layer 138 disposed between the lower electrode 150 and the upper electrode 152 may be about 10:1 to 30:1, but not limited thereto. In addition, at least one outer edge 140 of the intermediate dielectric layer 138 extends beyond at least one outer edge 154 of the upper electrode 152, so that the overall width $W_3$ of the intermediate dielectric layer 138 is wider than the sum of the widths $W_1$ of the upper electrodes 152. Since at least two intermediate dielectric layers 134 and 138 are disposed between the lower electrode 150 and the upper electrode 152, the breakdown voltage of the capacitor 104 may be further increased.

In order to enable one of ordinary skill in the art to implement the invention described in the present disclosure, the method for fabricating the semiconductor device of the present disclosure is described in detail below.

Figure 3:
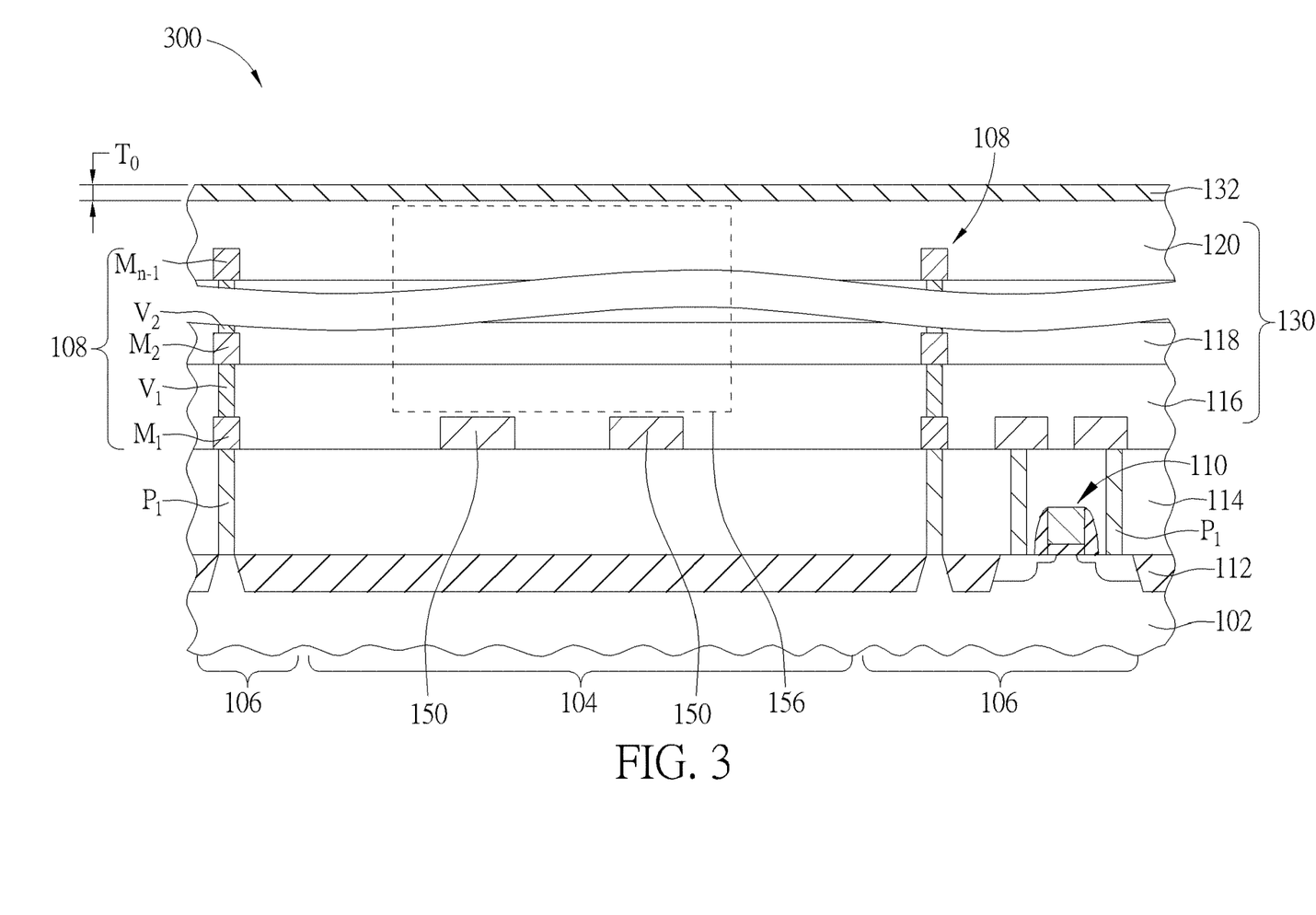
FIG. 3 is a schematic cross-sectional diagram of a semiconductor device after the formation of an intermediate dielectric layer according to one embodiment of the disclosure.
Figure 7:
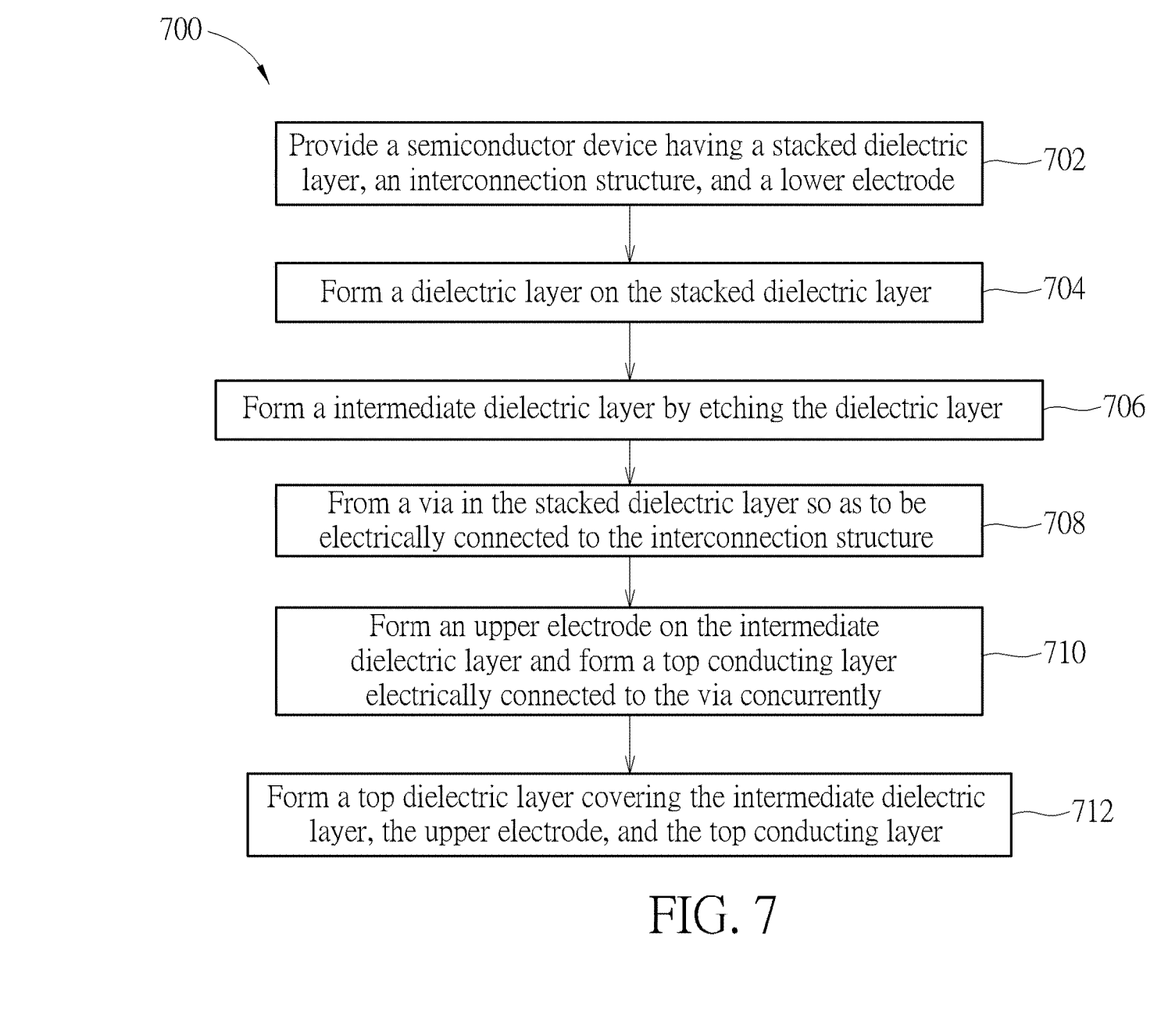
FIG. 7 is a flowchart illustrating a method for fabricating a semiconductor device according to one embodiment of the disclosure.

FIG. 3 is a schematic cross-sectional diagram of a semiconductor device after the formation of an intermediate dielectric layer according to one embodiment of the present disclosure, and FIG. 7 is a flowchart illustrating a method of fabricating the semiconductor device according to one embodiment of the present disclosure. Referring to FIG. 3, in step 702 of the method 700, a semiconductor device 300 is provided. The semiconductor device 300 includes at least a pre-metal dielectric 114, a stacked dielectric layer 130, an interconnect structure 108, and a lower electrode 150. Alternatively, the semiconductor device 300 may further include electronic components, such as a transistor 110, a conductive contact structure $P_1$, an intermediate metal layer $M_1$, $M_2$ to $M_{n-1}$, and plugs $V_1$ and $V_2$. The pre-metal dielectric 114 and each of the sub-dielectric layers 116, 118, and 120 in the stacked dielectric layer 130 may be formed on the substrate 102 by performing a chemical vapor deposition. The compositions of the sub-dielectric layers 116, 118, and 120 may be the same or different from each other. For example, the sub-dielectric layers 116, 118, and 120 may all be made of silicon oxide ($SiO_2$). In addition, the lower electrode 150 and the intermediate metal layer $M_1$ disposed on the surface of the pre-metal dielectric 114 may be formed concurrently in the same process so that the lower electrode 150 and the intermediate metal layer $M_1$ may have the same composition.

Subsequently, in step 704, a dielectric layer 132 is formed on the stacked dielectric layer 130. For example, a chemical vapor deposition may be performed to form a conformal dielectric layer 132 on the surface of the stacked dielectric layer 130. The thickness T0 may be about 0.5 to 1.0 μm, for example, 0.7 μm, but not limited thereto. The dielectric layer 132 may be a single-layered structure that directly contacts the stacked dielectric layer 130, and the relative permittivity of the dielectric layer 132 is greater than the average relative permittivity of the overall stacked dielectric layer 130, or greater than the relative permittivity of any one of the sub-dielectric layers 116, 118, and 120 of the stacked dielectric layer 130. For example, the dielectric layer 132 may be made of silicon nitride ($Si_3N_4$), silicon oxynitride (SiON), or silicon carbide (SiC), and each of the sub-dielectric layers 116, 118, and 120 may be silicon oxide ($SiO_2$), but not limited thereto. According to one embodiment of the present disclosure, a specific portion of the stacked dielectric layer 130 may be used as a capacitor dielectric layer 156. Therefore, for a case where the stacked dielectric layer 130 includes the sub-dielectric layers 116, 118, and 120, the capacitor dielectric layer 156 may also include sub-dielectric layers 116, 118, and 120.

Figure 4:
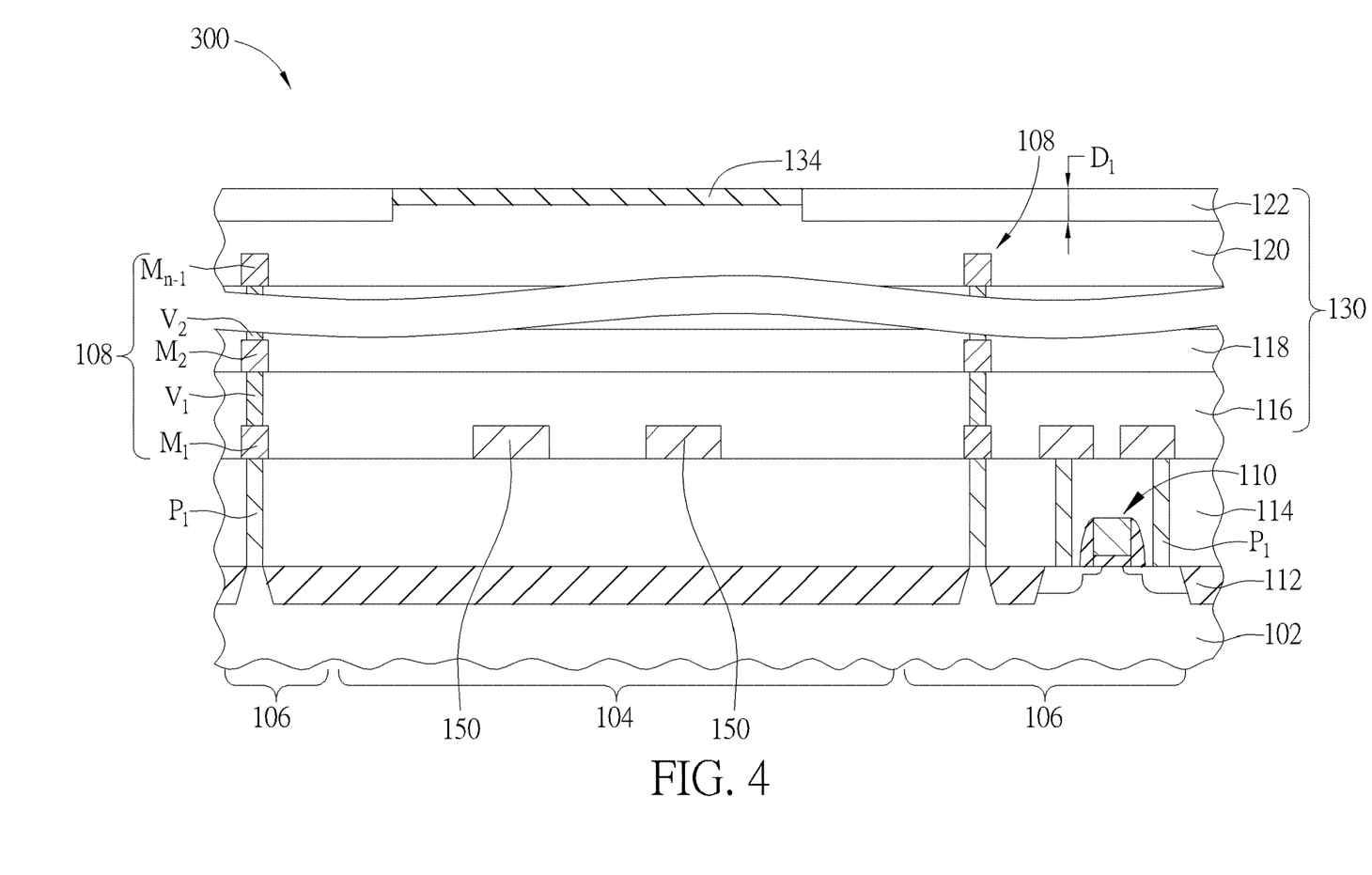
FIG. 4 is a schematic cross-sectional diagram of a semiconductor device after an intermediate dielectric layer is patterned according to one embodiment of the disclosure.

FIG. 4 is a schematic cross-sectional diagram of a semiconductor device after an intermediate dielectric layer is patterned according to one embodiment of the disclosure. Referring to FIG. 4, in step 706, the dielectric layer 132 is etched to form a patterned intermediate dielectric layer 134. The dielectric layer 132 in the interconnection region 106 may be removed through appropriate photolithography and etching processes. During the process of forming the intermediate dielectric layer 134, a portion of the sub-dielectric layer 120 may also be etched so as to form a recess with a depth of $D_1$ on the surface of the sub-dielectric layer 120. Then, a deposition process and a planarization process may be further performed to form another sub-dielectric layer 122 filling up the recess and surrounding the intermediate dielectric layer 134. According to one embodiment of the present disclosure, the thickness $T_1$ and $T_2$ of the intermediate dielectric layer 134 may be about 0.3 to 0.8 μm. For example, the thickness $T_1$ and $T_2$ of the intermediate dielectric layer 134 are preferably greater than 0.35 μm to avoid damages resulting from the subsequent etching process applied to the conductive layer 148. The relative permittivity of the intermediate dielectric layer 134 is greater than that of the sub-dielectric layer 122.

Figure 5:
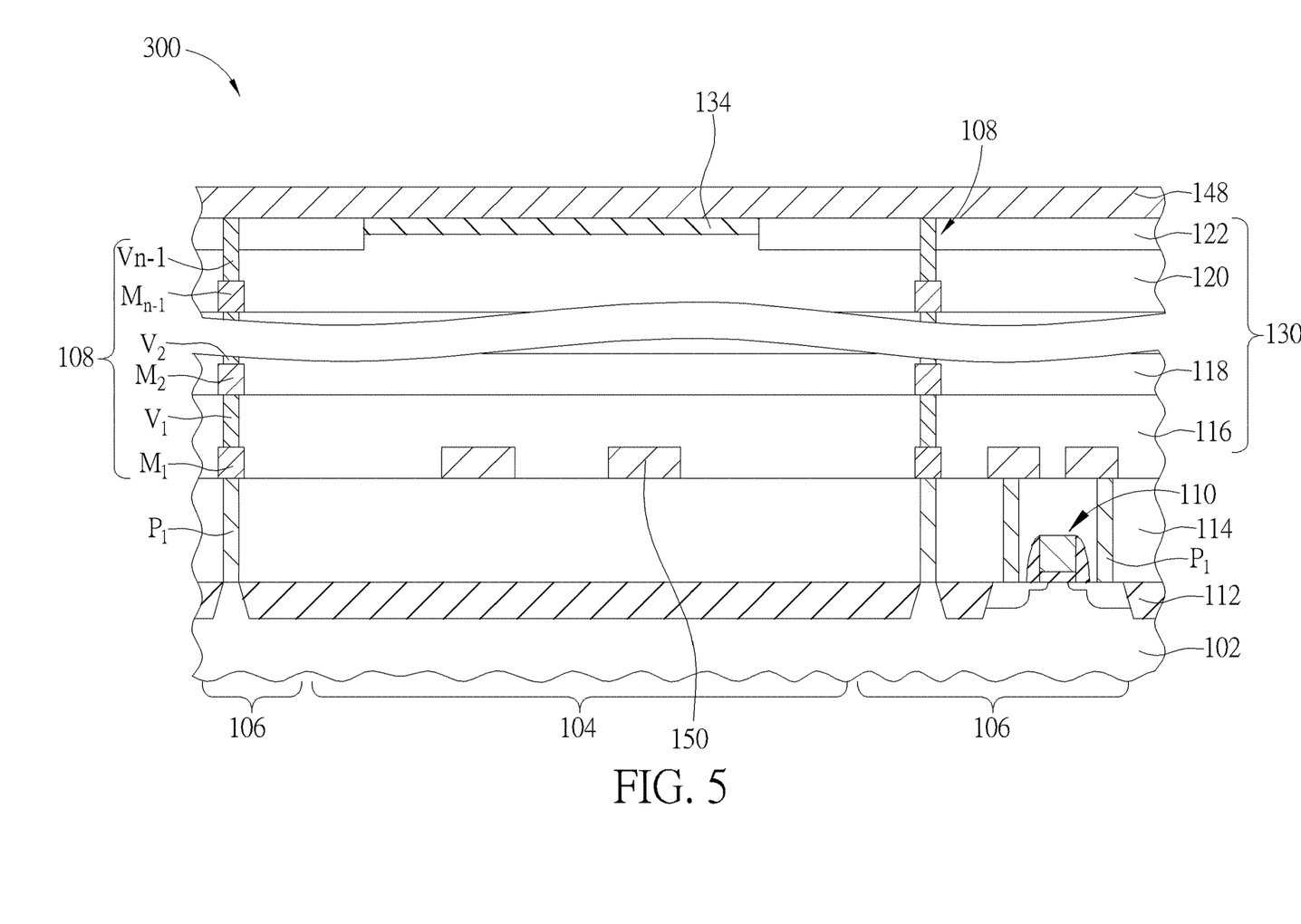
FIG. 5 is a schematic cross-sectional diagram of a semiconductor device after the formation of a plug according to one embodiment of the disclosure.

FIG. 5 is a schematic cross-sectional diagram of a semiconductor device after the formation of plugs according to one embodiment of the present disclosure. Referring to FIG. 5, in step 708, plugs electrically connected to the interconnect structure 108 are formed in the stacked dielectric layer 130. Several processes, such as photolithography and etching processes, may be performed to form holes in the sub-dielectric layers 120 and 122 not covered by the intermediate dielectric layer 134. The holes may penetrate the sub-dielectric layers 120 and 122 and expose the intermediate metal layer $M_{n-1}$. Then, processes, such as metal deposition and metal planarization, are performed to form plugs $V_{n-1}$ in the hole. The top surfaces of the plugs $V_{n-1}$ are approximately aligned with the top surface of the intermediate dielectric layer 134. Then, a conductive layer 148, such as a conductive metal layer, is blanket deposited on the intermediate dielectric layer 134 and the sub-dielectric layer 122.

Figure 6:
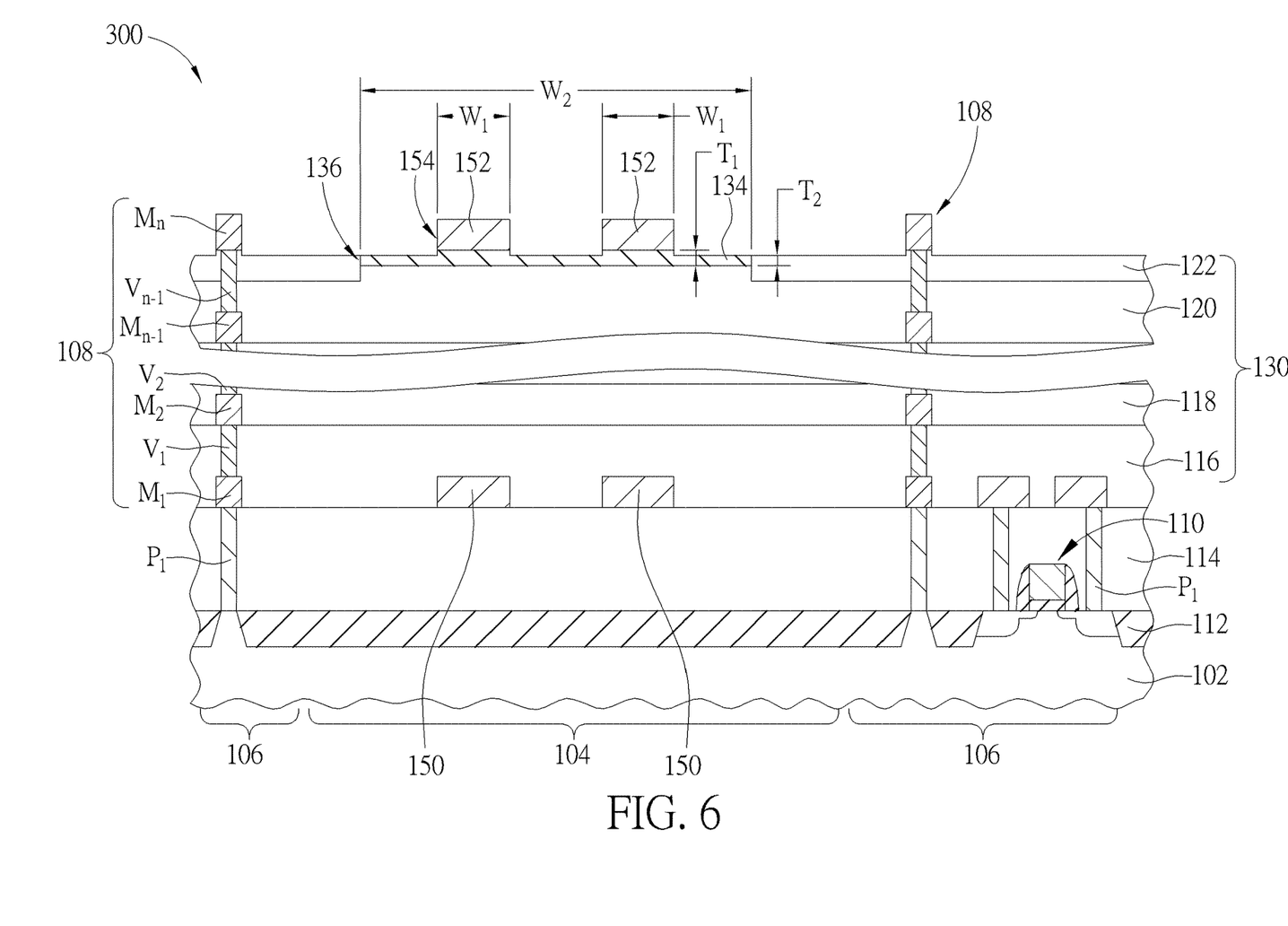
FIG. 6 is a schematic cross-sectional diagram of a semiconductor device after the formation of an upper electrode of a capacitor according to one embodiment of the disclosure.

FIG. 6 is a schematic cross-sectional diagram of a semiconductor device after the formation of an upper electrode of a capacitor according to one embodiment of the disclosure. Referring to FIG. 6, in step 710, after the structure shown in FIG. 5 is obtained, an upper electrode 152 may be formed on the patterned intermediate dielectric layer 134, and a top metal layer $M_n$ electrically connected to the plugs $V_{n-1}$ may be formed concurrently. The conductive layer 148 may be etched by performing processes, such as photolithography and etching processes, so as to fabricate the upper electrode 152 and the top metal layer $M_n$ concurrently. Since the upper electrode 152 and the top metal layer $M_n$ may be formed through the same processes concurrently, the upper electrode 152 and the top metal layer $M_n$ may have the same composition. During the etching process, the intermediate dielectric layer 134 and the sub-dielectric layer 122 not covered by the upper electrode 152 and the top metal layer $M_n$ may also be partially etched. Therefore, the intermediate dielectric layer 134 may have different thicknesses in different regions, such as a thickness $T_1$ and a thickness $T_2$.

Referring to FIG. 1, after completing the structure shown in FIG. 6, in step 712, a top dielectric layer 160 may be formed to cover the intermediate dielectric layer 134, the upper electrode 152, and the top metal layer $M_n$. The top dielectric layer 160 may be formed by performing deposition and planarization processes. Subsequently, other deposition and planarization processes may be performed to form a protection mask 162 covering the top dielectric layer 160. The composition of the top dielectric layer 160 may be silicon oxide, and the composition of the protection mask 162 may be silicon nitride, but not limited thereto.

According to the embodiments disclosed above, by providing the intermediate dielectric layer 134 with relatively high relative permittivity disposed between the lower electrode 150 and the upper electrode 152, the breakdown voltage of the capacitor and the semiconductor devices 100 and 200 as well as the voltage sustaining capability of the corresponding semiconductor devices 100 and 200 may be increased even though the distance between the upper electrode and the lower electrode in the capacitor is not increased, and the processes for fabricating the interconnection structure 108 process may be kept the same without further modifications.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A semiconductor device, comprising:
   a substrate,
   a capacitor, disposed on the substrate within a capacitor region, wherein the capacitor comprises:
      a lower electrode;
      an upper electrode, disposed over the lower electrode;
      a stacked dielectric layer, disposed between the lower electrode and the upper electrode; and
      an intermediate dielectric layer, disposed between the lower electrode and the upper electrode and disposed only within the capacitor region, wherein the relative permittivity of the intermediate dielectric layer is greater than the relative permittivity of the stacked dielectric layer; and
   an interconnection structure comprising at least a plug and a stack of metal layers, wherein the interconnection structure is disposed within an interconnection region abutting the capacitor region and is disposed at at least one side of the intermediate dielectric layer.
2. The semiconductor device of claim 1, wherein a ratio between the thickness of the stacked dielectric layer and the thickness of the intermediate dielectric layer is 10:1 to 30:1.

3. The semiconductor device of claim 1, wherein the composition of the stacked dielectric layer comprises silicon oxide, and the composition of the intermediate dielectric layer comprises silicon nitride, silicon oxynitride, or silicon carbide.

4. The semiconductor device of claim 1, wherein an outer edge of the intermediate dielectric layer extends beyond an outer edge of the upper electrode.

5. The semiconductor device of claim 1, wherein the upper electrode covers a portion of the intermediate dielectric layer, and the thickness of the portion of the intermediate dielectric layer covered by the upper electrode is greater than the thicknesses of other portions of the intermediate dielectric layer.

6. The semiconductor device of claim 1, wherein the intermediate dielectric layer is disposed between the stacked dielectric layer and the upper electrode.

7. The semiconductor device of claim 1, wherein the intermediate dielectric layer is a single-layered structure, and the intermediate dielectric layer directly contacts the stacked dielectric layer and the upper electrode.

8. The semiconductor device of claim 1, wherein the stacked dielectric layer comprises a plurality of sub-dielectric layers, and the intermediate dielectric layer is disposed between adjacent two of the sub-dielectric layers.

9. The semiconductor device of claim 1, wherein the stacked dielectric layer comprises a plurality of sub-dielectric layers, and the capacitor structure further comprises another intermediate dielectric layer disposed between adjacent two of the sub-dielectric layers, and a relative permittivity of the another intermediate dielectric layer is greater than a relative permittivity of the stacked dielectric layer.

10. The semiconductor device of claim 9, wherein a ratio between the thickness of the stacked dielectric layer and the thickness of the another intermediate dielectric layer is 10:1 to 30:1.

11. The semiconductor device of claim 1, wherein the semiconductor device further comprises a top dielectric layer surrounding the upper electrode and directly contacting the upper electrode, the intermediate dielectric layer, and the stacked dielectric layer.

12. The semiconductor device of claim 11, wherein the stack of metal layers comprises a top metal layer and at least one intermediate metal layer, the top metal layer being disposed in the top dielectric layer, wherein the top metal layer and the at least one intermediate metal layer directly contact the stacked dielectric layer.

13. The semiconductor device of claim 12, wherein the at least one plug is disposed in the stacked dielectric layer and electrically connected to the stack of metal layers.

* * * * *